(12) United States Patent
Sasaoka et al.

(10) Patent No.: US 7,968,800 B2
(45) Date of Patent: Jun. 28, 2011

(54) PASSIVE COMPONENT INCORPORATING INTERPOSER

(75) Inventors: Tatsuo Sasaoka, Osaka (JP); Yasuhiro Sugaya, Osaka (JP); Eiji Kawamoto, Osaka (JP); Kazuhiko Honjo, Osaka (JP); Toshiyuki Asahi, Osaka (JP); Chie Sasaki, Osaka (JP); Hiroaki Suzuki, Hyogo (JP)

(73) Assignee: Panasonic Corporation, Osaka (JP)

( * ) Notice: Subject to any disclaimer, the term of this patent is extended or adjusted under 35 U.S.C. 154(b) by 755 days.

(21) Appl. No.: 12/089,124

(22) PCT Filed: Nov. 27, 2007

(86) PCT No.: PCT/JP2007/072830
§ 371 (c)(1),
(2), (4) Date: Apr. 3, 2008

(87) PCT Pub. No.: WO2008/066028
PCT Pub. Date: Jun. 5, 2008

(65) Prior Publication Data
US 2010/0155119 A1    Jun. 24, 2010

(30) Foreign Application Priority Data
Nov. 30, 2006  (JP) .................................. 2006-323388

(51) Int. Cl.
*H05K 1/18* (2006.01)
*H01L 23/522* (2006.01)

(52) U.S. Cl. ........ 174/258; 361/761; 361/763; 361/767; 361/782; 174/255; 174/260; 257/678; 257/686; 257/700; 257/738; 257/532; 29/832; 438/106; 438/107; 438/127

(58) Field of Classification Search .................. 174/253, 174/250, 259–263, 534, 264, 265; 361/760–768, 361/782, 821, 783, 795, 803; 257/532–534, 528, 678, 686, 690, 621, 676, 537, 700, 723, 724, 758, 685, 777, 698, 691, 738, E23.021, E23.062, E23.079; 438/106, 107, 127, 613, 637, 667; 29/830, 832, 840, 846, 852, 890
See application file for complete search history.

(56) References Cited

U.S. PATENT DOCUMENTS
5,530,288 A * 6/1996 Stone ............................. 257/700
(Continued)

FOREIGN PATENT DOCUMENTS
JP      54-104564      8/1979
(Continued)

*Primary Examiner* — Michael V Datskovskiy
(74) *Attorney, Agent, or Firm* — Steptoe & Johnson LLP

(57) ABSTRACT

A passive component incorporating interposer includes a double-sided circuit board (1) having a wiring layer (8) on both sides, a passive component (2) mounted on the wiring layer (8) on one surface of the double-sided circuit board (1), a second insulating layer (3) made of woven fabric or non-woven fabric or inorganic filler and thermosetting resin laminated on the surface of the double-sided circuit board (1) mounted with the passive component (2), a first insulating layer (4) made of woven fabric or non-woven fabric or inorganic filler and thermosetting resin laminated on the other surface of the double-sided circuit board (1) not mounted with the passive component (2), first and second wiring layers (5, 6) formed on the first and second insulating layers (3, 4), and a through hole (7) for electrically connecting the wiring layers (8) disposed on both surfaces of the double-sided circuit board (1) and the first and second wiring layers (5, 6), where the first wiring layer (5) is formed to enable mounting of a semiconductor element (9).

6 Claims, 4 Drawing Sheets

U.S. PATENT DOCUMENTS

| | | | | |
|---|---|---|---|---|
| 5,770,476 A * | 6/1998 | Stone | | 438/106 |
| 6,274,937 B1 * | 8/2001 | Ahn et al. | | 257/777 |
| 6,346,743 B1 * | 2/2002 | Figueroa et al. | | 257/723 |
| 6,362,525 B1 * | 3/2002 | Rahim | | 257/738 |
| 6,407,929 B1 * | 6/2002 | Hale et al. | | 361/763 |
| 6,833,285 B1 * | 12/2004 | Ahn et al. | | 438/107 |
| 6,875,921 B1 * | 4/2005 | Conn | | 174/534 |
| 6,933,597 B1 * | 8/2005 | Poddar et al. | | 257/686 |
| 6,970,362 B1 * | 11/2005 | Chakravorty | | 361/782 |
| 7,120,031 B2 * | 10/2006 | Chakravorty et al. | | 361/762 |
| 7,220,667 B2 * | 5/2007 | Yamagata | | 438/637 |
| 7,233,061 B1 * | 6/2007 | Conn | | 257/686 |
| 7,446,389 B2 * | 11/2008 | Cornelius | | 257/532 |
| 7,583,511 B2 * | 9/2009 | Cornelius | | 361/763 |
| 7,613,007 B2 * | 11/2009 | Amey et al. | | 361/763 |
| 7,649,252 B2 * | 1/2010 | Sakai et al. | | 257/700 |
| 7,663,206 B2 * | 2/2010 | Lee | | 257/532 |
| 7,795,721 B2 * | 9/2010 | Kurita | | 257/698 |

FOREIGN PATENT DOCUMENTS

| | | |
|---|---|---|
| JP | 2002-319760 | 10/2002 |
| JP | 2006-216755 | 8/2006 |

\* cited by examiner

PASSIVE COMPONENT INCORPORATING INTERPOSER

The present application is based on International Application PCT/JP2007/072830, filed Nov. 27, 2007, which claims priority to Japanese Patent Application No. 2006-323388, filed Nov. 30, 2006, the entire contents of which are hereby incorporated by reference.

TECHNICAL FIELD

The present invention relates to a component incorporating circuit board that incorporates passive components.

BACKGROUND ART

Recently, with higher function of electronic equipments, the drive frequency is advancing towards higher frequency in the semiconductor element. With advancement towards higher frequency, a phenomenon in which the voltage temporarily lowers due to coil component and resistor component of the power supply wiring tends to easily occur when switching is performed with a circuit spaced apart from the power supply, which becomes a cause of malfunction of the semiconductor element. A bypass capacitor is connected between a power supply line of a circuit board mounted with the semiconductor element and a ground line to ensure stable power supply voltage and realize normal operation of the semiconductor element.

In order to exhibit the effect to its maximum, the capacitor needs to be arranged at a position as close as possible to the semiconductor element so as not to be influenced by the resistor component and the coil component of the wiring. This is handled in the related art by arranging the capacitor on the substrate mounted with the semiconductor element or the mother board to which the relevant substrate is further mounted. However, as the demand for miniaturization of the equipment became stricter, reduction of the region mounted with the capacitor is being desired.

As shown in patent document 1, attempt has been made to miniaturize the equipment by embedding the capacitor component in the circuit board and reducing the mounting area.

FIG. 4 shows a structure of a conventional passive component incorporating interposer. In FIG. 4, the conventional passive component incorporating interposer includes double-sided circuit board 1 including wiring layers 8 on both sides, passive component 2 mounted on one surface of double-sided circuit board 1, second insulating layer 3 laminated on a surface of double-sided circuit board 1 mounted with passive component 2, first insulating layer 4 laminated on the other surface of double-sided circuit board 1 not mounted with passive component 2, second wiring layer 6 laminated on second insulating layer 3, first wiring layer 5 laminated on first insulating layer 4, and through holes 7 for electrically connecting wiring layer 8, first wiring layer 5, and second wiring layer 6, where semiconductor element 9 is mounted on second wiring layer 6.

However, since passive component 2 is disposed arranged between semiconductor element 9 and inner layer wiring layer in the structure of the conventional passive component incorporating interposer, the wiring length for connecting semiconductor element 9 and passive component 2 becomes long, and the effectiveness of power supply voltage stabilization reduces even if a chip capacitor (not shown) is mounted as passive component 2. In order to avoid this, consideration is made in shortening the wiring length for connecting semiconductor element 9 and passive component 2 using two double-sided circuit boards 1, as shown in FIG. 5, but the cost increases since two expensive double-sided circuit boards 1 are used. In the structure of connecting semiconductor element 9 and passive component 2 using two double-sided circuit boards 1, through holes 7 need to be formed after aligning the wired patterns in advance, and thus the man-hour of the work increase, which becomes a problem in terms of mass production.

[Patent document 1] Unexamined Japanese Patent Publication No. 54-104564

DISCLOSURE OF THE INVENTION

In view of the above problems, it is an object of the present invention to provide a passive component incorporating interposer that has excellent electrical characteristics and that is of low cost and excels in mass productivity.

A passive component incorporating interposer according to the present invention comprises a resin substrate having a wiring layers on both sides; one or more passive components mounted on the wiring layer on one surface of the resin substrate; a first insulating layer made of woven fabric or non-woven fabric and thermosetting resin laminated on the other surface of the resin substrate not mounted with the passive component; a second insulating layer made of woven fabric or non-woven fabric and thermosetting resin laminated on the surface of the resin substrate mounted with the passive component and formed with a space larger than an outside dimension of the passive component; a first wiring layer formed on a surface of the first insulating layer not contacting the resin substrate; a second wiring layer formed on a surface of the second insulating layer not contacting the resin substrate; and a through hole for electrically connecting wiring layer disposed on both surfaces of the resin substrate, the first wiring layer, and the second wiring layer; wherein the first wiring layer is formed to enable mounting of a semiconductor element.

According to the present invention, the wiring length for electrically connecting the semiconductor element and the incorporating passive component can be reduced, and the power supply voltage can be stabilized. Thus, a passive component incorporating interposer that allows the circuit to normally operate even if the drive frequency of the semiconductor element becomes high and that is of low cost and excels in mass productivity is provided.

Figure 1:
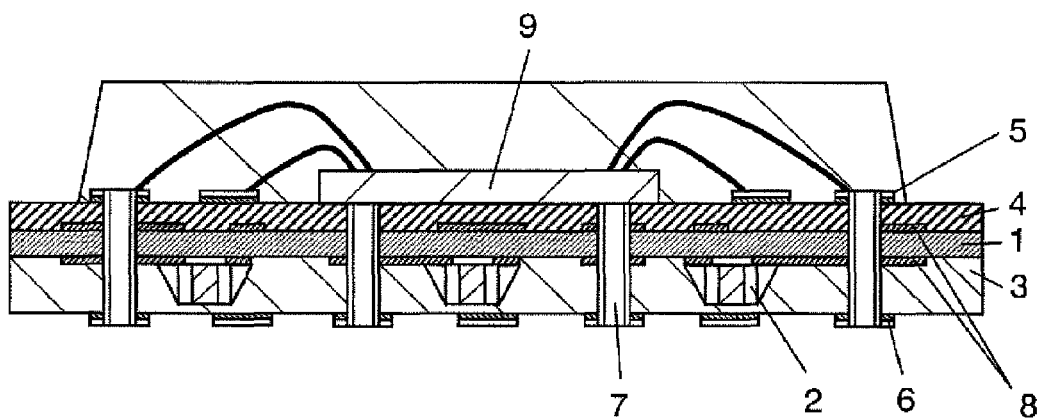
FIG. 1 is a cross sectional view of a passive component incorporating interposer according to a first embodiment and a second embodiment of the present invention.

REFERENCE MARKS IN THE DRAWINGS 1 double-sided circuit board
2 passive component
3 second insulating layer
4 first insulating layer
5 first wiring layer
6 second wiring layer
7 through hole
8 wiring layer
9 semiconductor element
10, 11 insulating layer
12 copper foil
13 opening
14 pass through hole
15 pass through hole conductor
16 composite sheet

PREFERRED EMBODIMENTS FOR CARRYING OUT OF THE INVENTION

The embodiments of the present invention will now be described in detail with reference to the drawings.

First Embodiment

As shown in FIG. 1, a passive component incorporating interposer according to a first embodiment of the present invention includes double-sided circuit board 1 having wiring layers 8 on both surfaces, passive component 2 mounted on wiring layer 8 on one surface side of double-sided circuit board 1, first insulating layer 4 laminated on the other surface of double-sided circuit board 1 not mounted with passive component 2, second insulating layer 3 laminated on the surface of double-sided circuit board 1 mounted with passive component 2 and formed with a space larger than an outside dimension of passive component 2, first wiring layer 5 laminated on a surface of first insulating layer 4 not contacting double-sided circuit board 1, second wiring layer 6 laminated on a surface of second insulating layer 3 not contacting double-sided circuit board 1, and through hole 7 for electrically connecting wiring layer 8 disposed on both surfaces of double-sided circuit board 1 and first and second wiring layers 5, 6, where first wiring layer 5 is formed to enable mounting of semiconductor element 9.

Thus, on first insulating layer 4 disposed on the other side of double-sided circuit board 1 not mounted with passive component 2, first wiring layer 5 is formed on the surface not contacting double-sided circuit board 1, the first wiring layer 5 is formed to enable mounting of semiconductor element 9, and thus the wiring length for electrically connecting passive component 2 and semiconductor element 9 can be reduced even if the outside dimension of passive component 2 such as chip capacitor, chip resistor, or the like is large, and resistor component and coil component in the power supply wiring can be reduced. The occurrence of temporary voltage drop when circuit operation such as switching operation is performed in semiconductor element 9 is thus suppressed, and the power supply voltage can be stabilized. Accordingly, the circuit can be normally operated even if the drive frequency of semiconductor element 9 becomes high in the passive component incorporating interposer.

Double-sided circuit board 1 includes wiring layers 8 on both sides of the substrate, and passive component 2 such as chip capacitor, chip resistor, or the like can be mounted thereon.

Double-sided circuit board 1 and first insulating layer 4 are made of woven fabric or non-woven fabric glass base material and epoxy resin. Second insulating layer 3 is made of epoxy resin and epoxy resin with woven fabric or non-woven fabric glass base material, and covers passive component 2. The epoxy resin, which is thermosetting resin, may be phenolic resin.

A method for manufacturing the passive component incorporating interposer will be described with reference to FIG. 2A to FIG. 2F.

Figure 2A:
FIG. 2A is a cross sectional view of a manufacturing process of the passive component incorporating interposer according to the first embodiment of the present invention.

First, as shown in FIG. 2A, passive component 2 is mounted on one side of double-sided circuit board 1 having wiring layer 8 on both sides. Normally, in a semiconductor package structure adopting resin BGA (Ball Grid Array) substrate for connecting a substrate and an LSI using wire bonding, the thickness of the interposer substrate is defined between 0.56 mm±0.05 mm. The thickness of the incorporating chip capacitor is set to less than or equal to 0.22 mm as a condition to comply with the thickness restriction.

Specifically, a chip capacitor of 1005 size and 0.15 mm thick is used as passive component 2 to be mounted on one surface of double-sided circuit board 1. Thus there are not many restrictions on resist formation and mounting is facilitated. A chip capacitor of 0402 size may be used to satisfy the above conditions.

Solder is generally used for the connection of wiring layer 8 of double-sided circuit board 1 and passive component 2, but conductive resin adhesive or melting point changing solder paste in which the melting point shifts towards high temperature side after joining may be used. In the latter case, for example, the phenomenon of solder flow or the like can be avoided, whereby the chip component can be mounted without PSR, and solder flow can be prevented even when assuming the reflow soldering after manufacturing of the interposer. Passive component 2 of 0402 size subjected to restraints of dimension and the like then can be mounted.

Figure 2B:
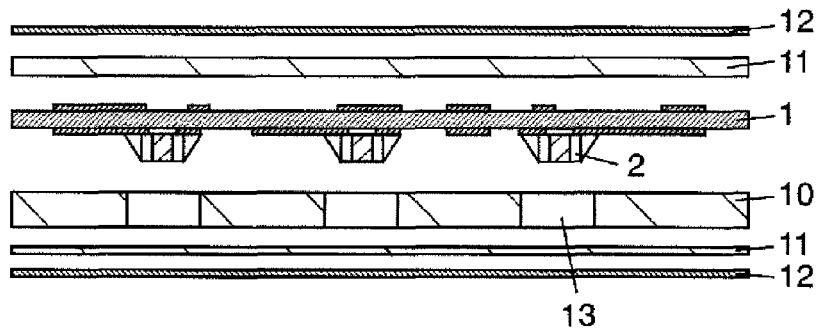
FIG. 2B is a cross sectional view of the manufacturing process of the passive component incorporating interposer according to the first embodiment of the present invention.

As shown in FIG. 2B, insulating layer 10 (uncured state) including opening 13 according to arrangement of passive component 2, insulating layer 11 without opening 13, and copper foil 12 are stacked on the surface of double-sided circuit board 1 mounted with passive component 2, and similarly, insulating layer 11 (uncured state) without opening 13 and copper foil 12 are stacked on the surface of double-sided circuit board 1 not mounted with passive component 2.

Double-sided circuit board 1, insulating layers 10, 11, and copper foil 12 are pressed while being heated in laminated state.

First, insulating layer 10 with opening 13 of uncured state, and insulating layer 11 without opening 13 are pressurized while being heated for about 30 minutes at 110° C. at which the epoxy resin softens.

Figure 2C:
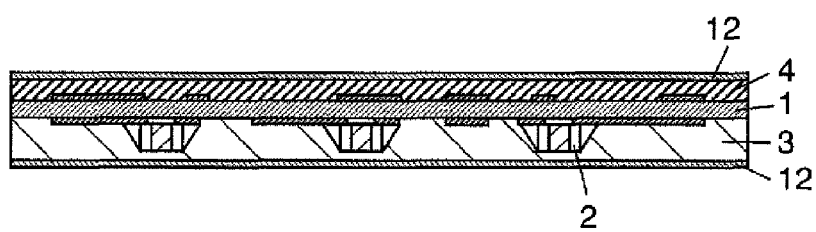
FIG. 2C is a cross sectional view of the manufacturing process of the passive component incorporating interposer according to the first embodiment of the present invention.

Thus, the epoxy resin of insulating layer 10 with opening 13 and insulating layer 11 without opening 13 melts out into opening 13 as shown in FIG. 2C, thereby covering passive component 2 and connection electrode portions at the lower surface of passive component 2.

Thereafter, as shown in FIG. 2C, heating is performed up to 200° C. in a pressurized state, thereby curing the epoxy resin. Second insulating layer 3 is thereby formed on the one surface of double-sided circuit board 1 mounted with passive component 2, and first insulating layer 4 is formed on the other surface of double-sided circuit board 1 not mounted with passive component 2.

Figure 2D:
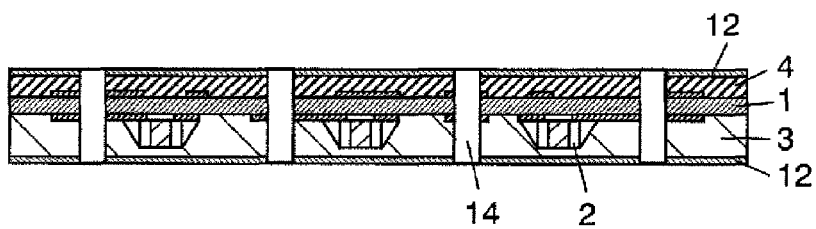
FIG. 2D is a cross sectional view of the manufacturing process of the passive component incorporating interposer according to the first embodiment of the present invention.
Figure 2E:
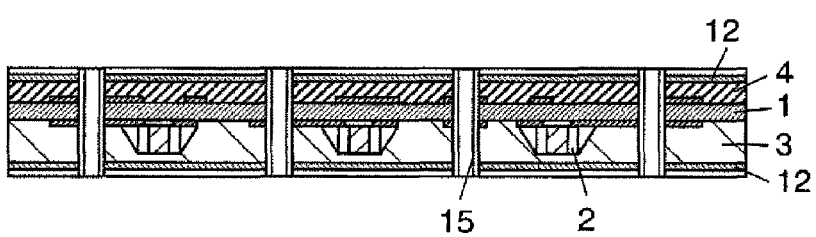
FIG. 2E is a cross sectional view of the manufacturing process of the passive component incorporating interposer according to the first embodiment of the present invention.
Figure 2F:
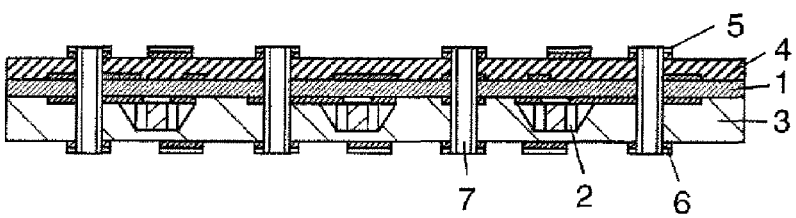
FIG. 2F is a cross sectional view of the manufacturing process of the passive component incorporating interposer according to the first embodiment of the present invention.

As shown in FIG. 2D, through hole 14 is perforated at a predetermined position. Thereafter, through hole conductor part 15 by plating is formed in pass-through hole 14, as shown in FIG. 2E, and the copper foil of the outermost peripheral part is patterned, as shown in FIG. 2F.

The passive component incorporating interposer is completed through the above steps.

According to the structure of such passive component incorporating interposer, the wiring layer laminated at the outermost peripheral part is in the state of copper foil 12, as shown in FIG. 2D, and drilling etc. can be performed targeting only the pattern shape of wiring layer 8 of double-sided circuit board 1 when processing through hole 14, whereby alignment is facilitated and mass productivity is enhanced.

Figure 5:
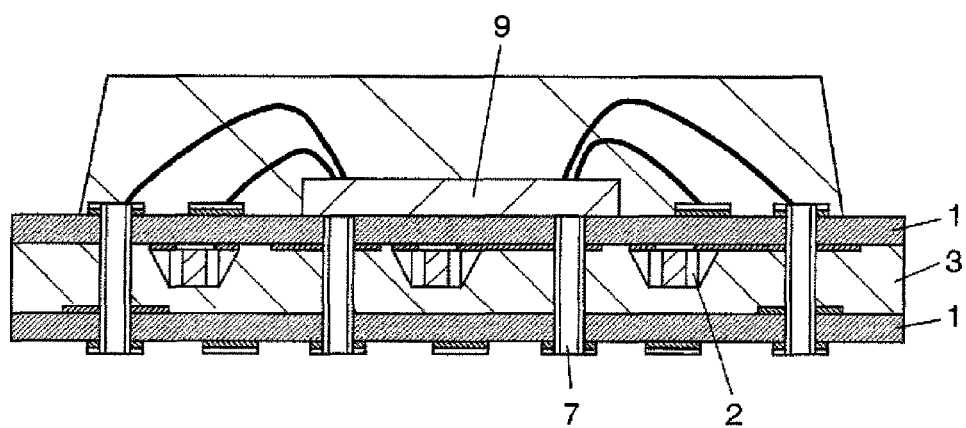
FIG. 5 is a cross sectional view of the conventional passive component incorporating interposer.

The cost can be suppressed compared to the structure (FIG. 5) using two expensive double-sided circuit boards 1 since one double-sided circuit board 1 is used.

Second Embodiment

As shown in FIG. 1, a passive component incorporating interposer according to a second embodiment of the present invention has a configuration similar to the passive component incorporating interposer according to the first embodiment. That is, double-sided circuit board 1 having wiring layers 8 on both sides, passive component 2 mounted on wiring layer 8 on one surface of double-sided circuit board 1, first insulating layer 4 stacked on the other surface of double-sided circuit board 1 not mounted with passive component 2, second insulating layer 3 laminated on the surface of double-sided circuit board 1 mounted with passive component 2, first wiring layer 5 laminated on a surface of first insulating layer 4 not contacting double-sided circuit board 1, second wiring layer 6 stacked on a surface of second insulating layer 3 not contacting double-sided circuit board 1, and through holes 7 for electrically connecting wiring layers 8 disposed on both sides of double sided circuit board 1 and first and second wiring layers 5, 6, where first wiring layer 5 is formed to enable mounting of semiconductor element 9.

Double-sided circuit board 1 is made of glass base material and epoxy resin. Furthermore, first insulating layer 4 and second insulating layer 3 are made of inorganic filler and epoxy resin.

A method for manufacturing the passive component incorporating interposer according to the second embodiment will be described with reference to FIG. 3A to FIG. 3F.

Figure 3A:
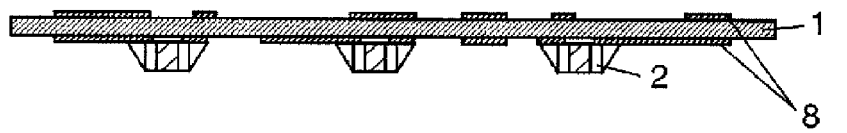
FIG. 3A is a cross sectional view of a manufacturing process of a passive component incorporating interposer according to a second embodiment of the present invention.

First, as shown in FIG. 3A, passive component 2 is mounted on one side of double-sided circuit board 1 having wiring layers 8 on both sides. In the present embodiment as well, a chip capacitor of 1005 size and 0.15 mm thick is used as the passive component to be mounted, similar to the first embodiment.

Solder is generally used for the connection of wiring layers 8 of double-sided circuit board 1 and passive component 2, but conductive resin adhesive or melting point changing solder paste in which the melting point shifts towards high temperature side after joining may be used. In the latter case, for example, the phenomenon of solder flow or the like can be avoided, whereby the chip component can be mounted without PSR. Passive component 2 of 0402 size or the like subjected to restraints of dimension then can be easily mounted.

Figure 3B:
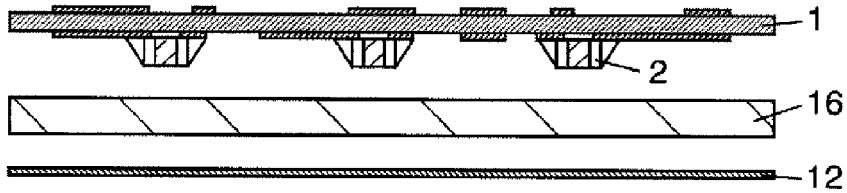
FIG. 3B is a cross sectional view of the manufacturing process of the passive component incorporating interposer according to the second embodiment of the present invention.

As shown in FIG. 3B, composite sheet 16 made of inorganic filler and epoxy resin and copper foil 12 are stacked on both sides of double-sided circuit board 1 mounted with passive component 2, as shown in FIG. 3B.

Double-sided circuit board 1, composite sheet 16, and copper foil 12 are pressurized while being heated in an overlapping state.

Figure 3C:
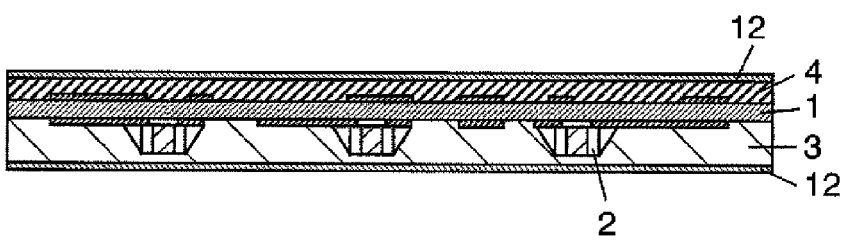
FIG. 3C is a cross sectional view of the manufacturing process of the passive component incorporating interposer according to the second embodiment of the present invention.

Thereafter, as shown in FIG. 3C, heating is performed up to 200° C. under a pressed state, thereby curing the epoxy resin. Second insulating layer 3 is thereby formed on the one surface of double-sided circuit board 1 mounted with passive component 2, and first insulating layer 4 is formed on the other surface of double-sided circuit board 1 not mounted with passive component 2.

Figure 3D:
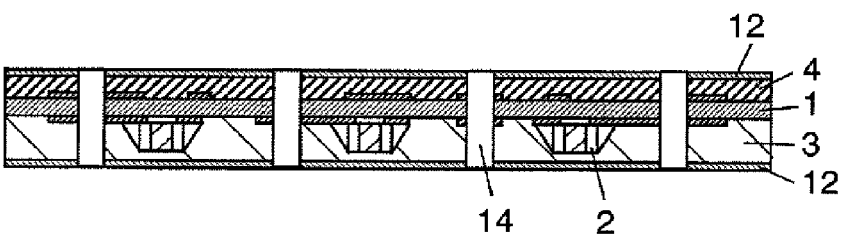
FIG. 3D is a cross sectional view of the manufacturing process of the passive component incorporating interposer according to the second embodiment of the present invention.
Figure 3E:
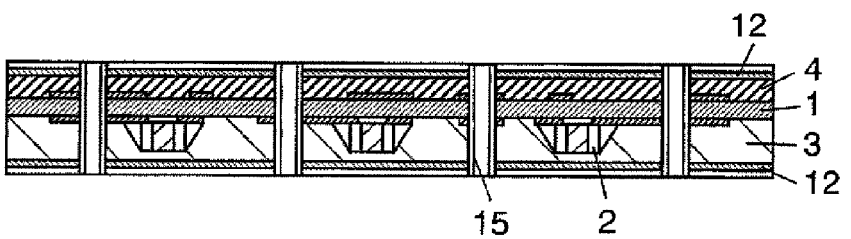
FIG. 3E is a cross sectional view of the manufacturing process of the passive component incorporating interposer according to the second embodiment of the present invention.
Figure 3F:
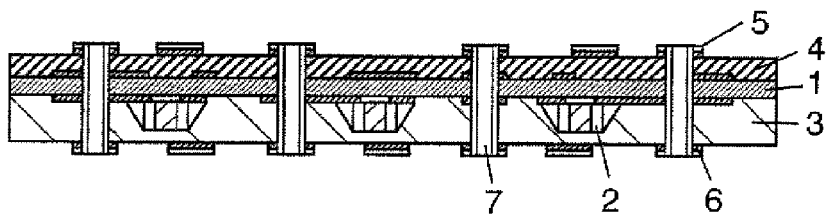
FIG. 3F is a cross sectional view of the manufacturing process of the passive component incorporating interposer according to the second embodiment of the present invention.
Figure 4:
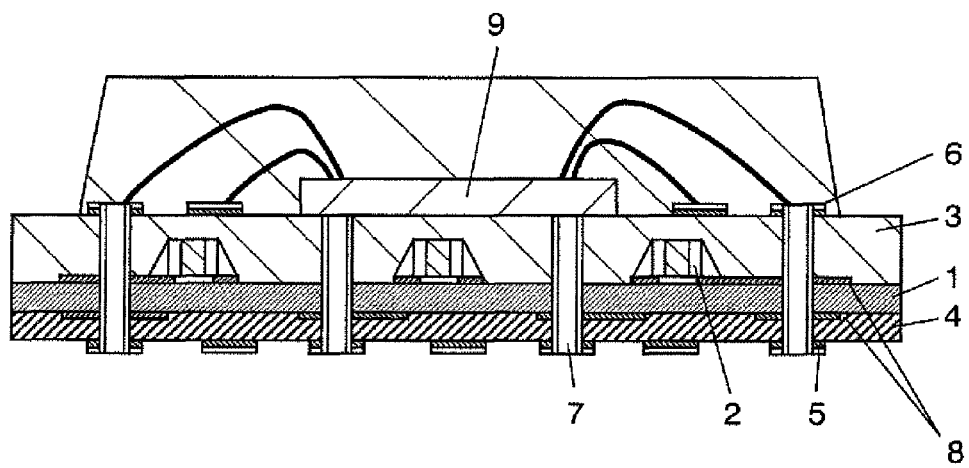
FIG. 4 is a cross sectional view of a conventional passive component incorporating interposer.

As shown in FIG. 3D, through hole 14 is perforated at a predetermined position. Thereafter, through hole conductor part 15 by plating is formed in through hole 14, as shown in FIG. 3E, and the copper foil of the outermost peripheral part is patterned, as shown in FIG. 3F.

The passive component incorporating interposer is completed through the above steps. In addition to the effects of the first embodiment, type correspondence improves and positioning failure of the insulating layers are eliminated since a space does not need to be formed in the insulating layer in advance in the second embodiment. Thus, mass productivity is further enhanced in manufacturing the passive component incorporating interposer.

As shown in FIG. 1, the wire bonding method has been described by way of example as a method of mounting semiconductor element 9 in the first embodiment and the second embodiment, but other mounting methods such as flip-chip mounting may be used.

INDUSTRIAL APPLICABILITY

As described above, the present invention is useful as a passive component incorporating interposer and the like that is easy to put to practical use and that can respond to higher frequency of the drive frequency of the semiconductor element as it is of low cost and excels in mass productivity.

The invention claimed is:

1. A passive component incorporating interposer comprising:
   a resin substrate having wiring layers on both surfaces;
   one or more passive components mounted on the wiring layer on one surface of the resin substrate;
   a first insulating layer made of woven fabric or non-woven fabric and thermosetting resin laminated on the other surface of the resin substrate not mounted with the passive component;
   a second insulating layer made of woven fabric or non-woven fabric and thermosetting resin laminated on the surface of the resin substrate mounted with the passive component and formed with a space larger than an outside dimension of the passive component;

a first wiring layer formed on a surface of the first insulating layer not contacting the resin substrate;

a second wiring layer formed on a surface of the second insulating layer not contacting the resin substrate; and a through hole for electrically connecting the wiring layers disposed on both sides of the resin substrate, the first wiring layer, and the second wiring layer; wherein the first wiring layer is formed to enable mounting of a semiconductor element.

2. A passive component incorporating interposer comprising:

a resin substrate having wiring layers on both surfaces;

one or more passive components mounted on the wiring layer on one surface of the resin substrate;

a first insulating layer made of inorganic filler and thermosetting resin laminated on the other surface of the resin substrate not mounted with the passive component;

a second insulating layer made of inorganic filler and thermosetting resin laminated on the surface of the resin substrate mounted with the passive component;

a first wiring layer formed on a surface of the first insulating layer not contacting the resin substrate;

a second wiring layer formed on a surface of the second insulating layer not contacting the resin substrate; and a through hole for electrically connecting wiring layers disposed on both surfaces of the resin substrate, the first wiring layer, and the second wiring layer; wherein the first wiring layer is formed to enable mounting of a semiconductor element.

3. The passive component incorporating interposer according to claim 1, wherein the passive component is at least a chip capacitor.

4. The passive component incorporating interposer according to claim 1, wherein the passive component is a chip capacitor and a chip resistor.

5. The passive component incorporating interposer according to claim 2, wherein the passive component is at least a chip capacitor.

6. The passive component incorporating interposer according to claim 2, wherein the passive component is a chip capacitor and a chip resistor.

* * * * *